United States Patent [19]
Lowrey et al.

[11] Patent Number: 5,223,734
[45] Date of Patent: Jun. 29, 1993

[54] SEMICONDUCTOR GETTERING PROCESS USING BACKSIDE CHEMICAL MECHANICAL PLANARIZATION (CMP) AND DOPANT DIFFUSION

[75] Inventors: Tyler A. Lowrey; Trung T. Doan; Gurtej S. Sandhu, all of Boise, Id.

[73] Assignee: Micron Technology, Inc., Boise, Id.

[21] Appl. No.: 813,291

[22] Filed: Dec. 18, 1991

[51] Int. Cl.⁵ .................... H01L 21/304; H01L 21/38
[52] U.S. Cl. .................................... 257/401; 257/350; 437/12
[58] Field of Search .................. 437/12, 974; 148/DIG. 135, DIG. 60; 357/52; 257/401, 350

[56] References Cited

U.S. PATENT DOCUMENTS

| | | | |
|---|---|---|---|
| 3,529,347 | 9/1970 | Ingless et al. | 29/571 |
| 3,783,119 | 1/1974 | Gregor et al. | 204/192 |
| 3,997,368 | 12/1976 | Petroff et al. | 148/1.5 |
| 4,370,180 | 1/1983 | Azuma et al. | 21/225 |
| 4,498,227 | 2/1985 | Howell et al. | 29/576 |
| 4,563,698 | 1/1986 | Nilarp | 357/38 |
| 4,577,210 | 3/1986 | Gault | 357/38 |
| 4,589,928 | 5/1986 | Dalton et al. | 148/1.5 |
| 4,668,304 | 5/1987 | Schachameyer et al. | 148/1.5 |
| 4,960,731 | 10/1990 | Spitz et al. | 437/152 |

FOREIGN PATENT DOCUMENTS

| | | |
|---|---|---|
| 56-83948 | 9/1981 | Japan . |
| 57-28353 | 2/1982 | Japan . |
| 63-102325 | 5/1988 | Japan . |
| 62-228722 | 9/1988 | Japan . |

OTHER PUBLICATIONS

Bratter, R., et al, "Dielectric Structure as an Out-Diffusion Barrier" IBM Tech. Disc. Bull. vol. 6, p. 1422, Nov. 1970.

Schwuttle, G., et al, "New Gittering . . . Oxygen Precipitation", IBM Tech. Disc. Bull vol. 26, No. 7, Jun. 1983 p. 245.

Wolf S., et al, Silicon Processing for the VLSI Era, vol. 1, 1986, pp. 63-66, 182-194 264-5.

R. W. Gregor et al. (J. Appl Physics, 64 14), 1988.

Primary Examiner—George Fourson
Attorney, Agent, or Firm—Stephen A. Gratton

[57] ABSTRACT

A gettering process for semiconductor manufacturing is disclosed. The gettering process is performed after device formation and after a protective layer such as (BPSG) or (PSG) has been applied to the front side of a semiconductor wafer. The gettering process includes thinning and roughening a backside of the wafer using chemical mechanical planarization (CMP). During the (CMP) dislocations are formed which function as a trap of mobile contaminants. Additionally a gettering agent such as phosphorus is deposited and diffused into the backside of the wafer. The wafer can then be annealed for driving in the gettering agent and segregating mobile contaminants in the wafer at gettering centers formed at the dislocations and at gettering agent sites within the wafer crystal structure. The annealing step may also function to reflow and planarize the (BPSG) or (PSG) protective layer.

15 Claims, 2 Drawing Sheets

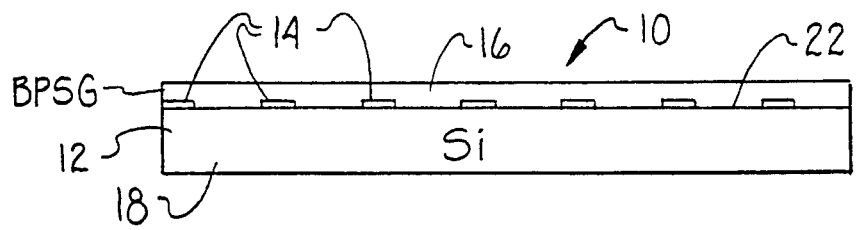
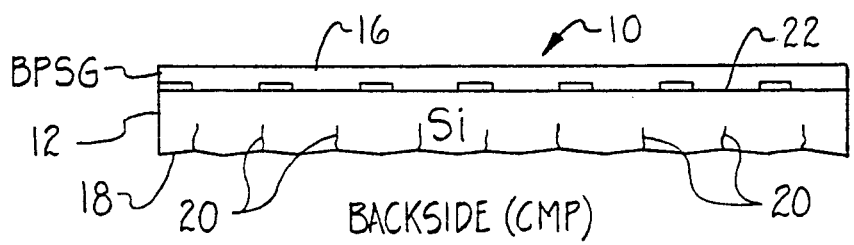
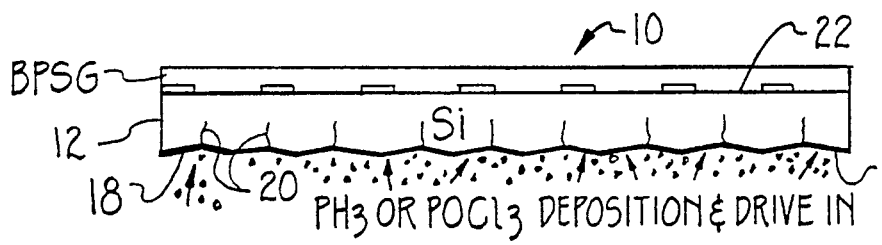
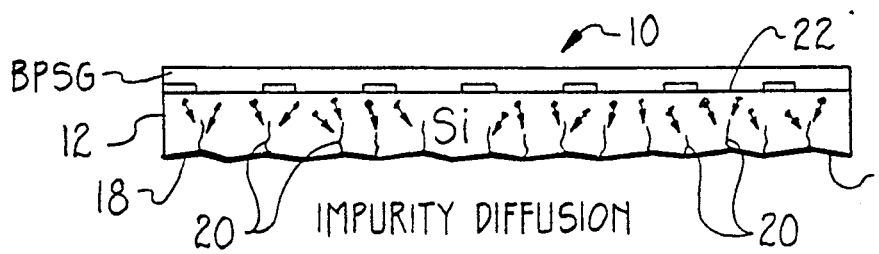
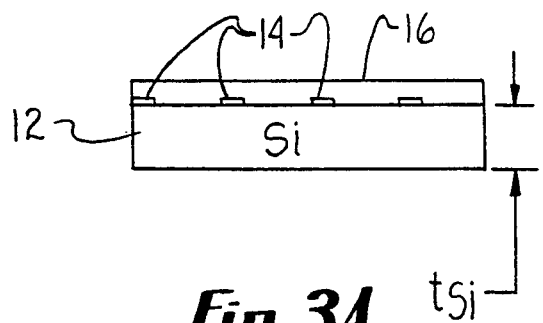
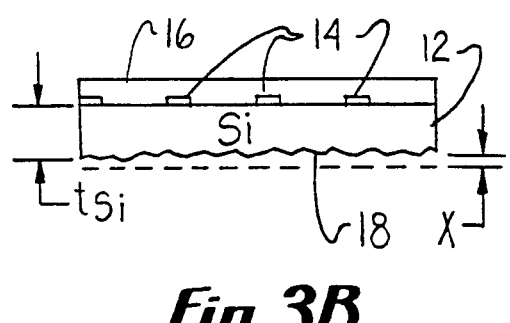

SEMICONDUCTOR GETTERING PROCESS USING BACKSIDE CHEMICAL MECHANICAL PLANARIZATION (CMP) AND DOPANT DIFFUSION

TECHNICAL FIELD

This invention is related to semiconductor manufacture and more particularly to a gettering process in which chemical mechanical planarization (CMP) is used to thin and roughen a semiconductor wafer and is combined with phosphorus diffusion to accomplish gettering.

BACKGROUND OF THE INVENTION

In various semiconductor manufacturing processes it may be difficult to control the concentration of mobile contaminants such as ionic contaminants introduced into the wafer during manufacture. These contaminants, which are typically in the form of metal impurities, may adversely affect the electrical characteristics of the completed semiconductor devices. In order to remove these impurities, a trapping phenomenon known as gettering may be used to attract the impurities away from the semiconductor devices into inactive regions of the wafer.

As an example, U.S. Pat. No. 3,783,119 to Gregor et al. discloses a process wherein a layer of phosphorus pentoxide ($P_2O_5$) is deposited on a layer of silicon dioxide to form a glass to getter sodium ionic impurities away from the silicon dioxide.

A gettering agent such as phosphorus may also be used to introduce interfacial misfit dislocations in the semiconductor crystal lattice. These dislocations function as a trap for the mobile ionic contaminants. This type of gettering process is usually carried out by diffusion of phosphorus into the wafer at relatively high temperatures. U.S. Pat. No. 3,997,368 to Petroff et al. discloses such a gettering process.

It is also known in the art to induce crystal damage in the semiconductor lattice by damaging the backside of the wafer. Backside damage causes the growth of dislocations that radiate up into the wafer. There dislocations then act as a gettering center or trap for the mobile impurities.

As an example the use of backside ion implantation as well as MeV Carbon implantation for gettering metal impurities has been demonstrated recently. [1] Implantation damage and phosphorus diffusion are instrumental in gettering because of the affinity of metal atoms to diffuse to inactive regions during a subsequent annealing step known as segregation annealing. Any high temperature steps after the segregation annealing however, can diminish the effectiveness of segregation by detrapping of the captured impurities.

There is therefore a need in the art for a gettering process that can be accomplished preferably subsequently to other high temperature process steps. It is therefore an object of this invention to provide a gettering process that can be consistently duplicated in large scale repetitive semiconductor manufacture subsequent to high temperature processes. It is another object of this invention to provide a gettering process that thins the wafer such that contaminants have a smaller distance to travel to gettering centers. Yet another object of the invention is to provide a gettering process using backside stress induced damage combined with diffusion of a gettering agent such as phosphorus. It is a further object of the invention to provide a gettering process that is simple, consistent, and cost effective.

SUMMARY OF THE INVENTION

In accordance with the present invention a gettering process for semiconductor manufacture is provided. The gettering process, simply stated, includes thinning and roughening the backside of the wafer using chemical mechanical planarization (CMP) combined with diffusion of a gettering agent, such as phosphorus, into the backside of the wafer. The thinning and roughening of the wafer using (CMP) as well as the diffusion of the gettering agent are performed relatively late in the semiconductor manufacturing process preferably after other high temperature steps and after a protective layer such as (BPSG) or (PSG) has been applied to the front side of the wafer. The front side of the wafer is thus protected against contamination during the gettering process. Additionally, a (BPSG) reflow anneal can be used for driving the gettering agent into the wafer and as a segregation anneal for attracting contaminants to the gettering centers.

Other objects, advantages and capabilities of the present invention will become more apparent as the description proceeds.

BRIEF DESCRIPTION OF THE DRAWINGS

FIGS. 2A-2D are schematic drawings of the steps involved in processing a semiconductor wafer in accordance with the invention; and FIGS. 3A and 3B are schematic drawings illustrating a thinning of the wafer by the process of the invention.

DESCRIPTION OF PREFERRED EMBODIMENTS

Figure 1:
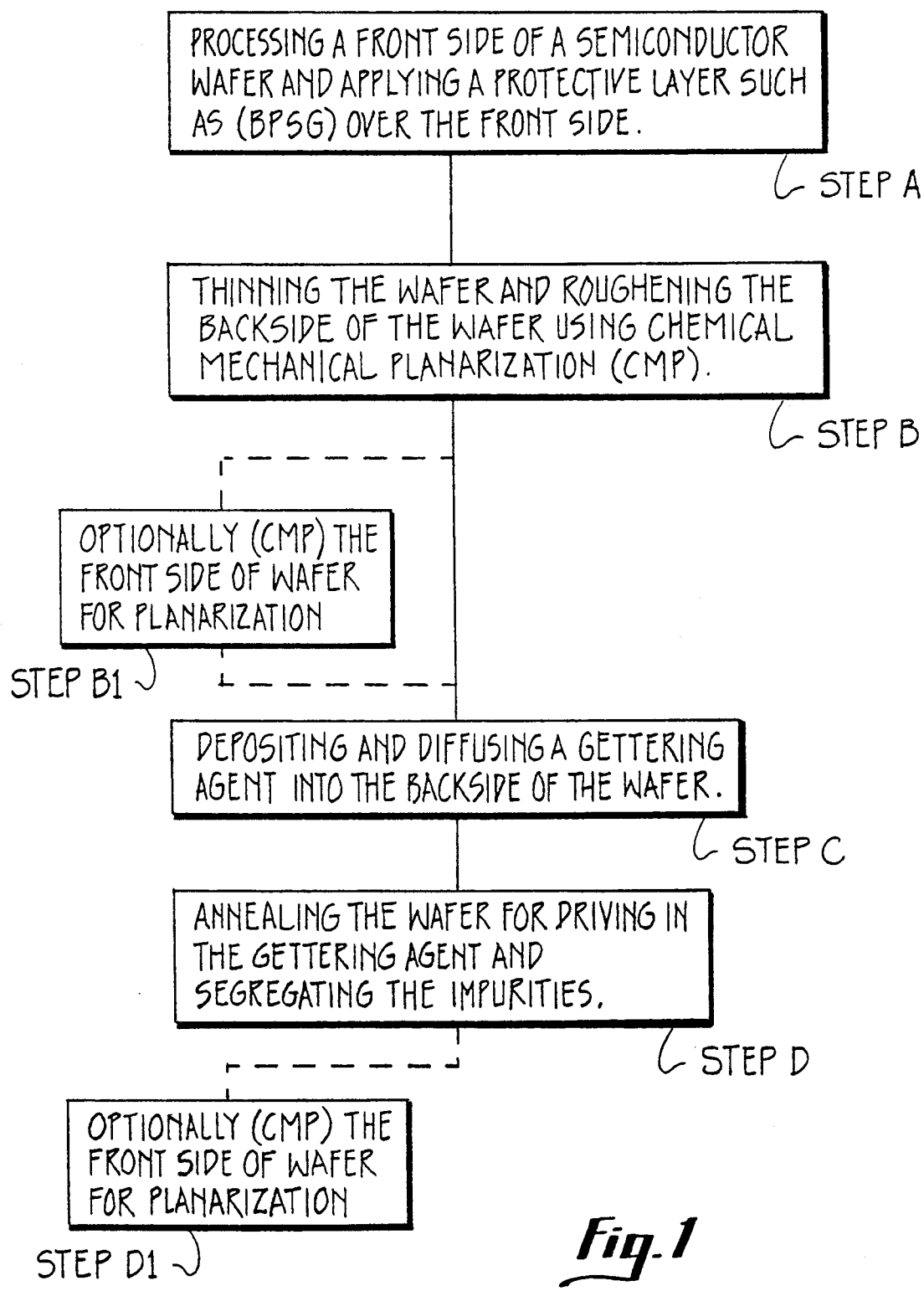
FIG. 1 is a flow diagram of the steps involved in a semiconductor gettering process in accordance with the invention.

Referring now to FIG. 1 the broad steps involved in a semiconductor gettering process in accordance with the invention are shown. The gettering process simply stated, includes the steps of:

processing a front side of a semiconductor wafer to form semiconductor devices and applying a protective layer such as (BPSG) or (PSG) over the front side, step A;

thinning and roughening the backside of the wafer using chemical mechanical planarization (CMP), step B;

depositing and diffusing a gettering agent into the backside of the wafer, step C; and annealing the wafer for driving in the gettering agent and segregating the contaminants or impurities, step D.

As optional steps, the front side of the wafer may be chemically mechanically planarized (CMP) to planarize the protective, BPSG layer, step B1; prior to step C. Additionally, as another optional step, step D1; the front side of the wafer may be chemically mechanically planarized (CMP) after the annealing step, step D, if required, to further planarize the protective (BPSG) layer. Moreover, the annealing step may be performed as a single step or in separate stages.

The process is shown sequentially in FIGS. 2A-2D. In FIG. 2A a semiconductor wafer is generally designated as 10. The semiconductor wafer 10 includes a silicon substrate 12 on which a plurality of semiconductor circuit devices 14 have been formed on a semiconducting front side 22. The circuit devices 14 may include CMOS transistors, resistors, diodes, capacitors and others that are formed in and on the semiconducting front side 22 of the wafer 10 by patterning and layering techniques that are known in the art.

During device formation, a protective layer may also be formed on the wafer front side 22. As an example during formation of the various semiconductor devices 14 a silicon dioxide layer (not shown) may be formed on the front side 22 of the wafer 10. This silicon dioxide layer may then be doped to improve protective characteristics and flow properties or for use as dopant sources. Boron and phosphorus are typically used as dopants. The resultant glass is referred to as phosphorous silicate glass (PSG) if just phosphorous is used as a dopant or borophosphorus silicate glass (BPSG) if both boron and phosphorous are used as dopants. In the illustrative embodiment of the invention the layer is (BSPG) and is designated as (BPSG) layer 16 in FIGS. 2A–2D.

The (BPSG) layer 16 may be initially deposited by a technique such as chemical vapor deposition (CVD) using a phosphorus source such as phosphine ($PH_3$) gas. The wafer surface may also be exposed to a boron source such as diborane ($B_2H_6$) gas. The resultant (BPSG) layer 16 may then be planarized by an annealing process. This annealing process is referred to as a (BPSG) reflow anneal. In general the (BPSG) reflow anneal is performed at an annealing temperature in the range of 700° C. to 1050° C. As will be more fully explained this reflow anneal may be combined with a subsequent anneal of the gettering process (Step D, FIG. 1) for driving in a gettering agent and for segregating contaminants in the wafer such as metal and ionic impurities.

The (BPSG) layer 16 insulates and protects the semiconductor devices 14 formed on the silicon substrate 12. Additionally, mobile impurities or contaminants such as ions or metals, become attached to the phosphorus in the (BPSG) and are prevented from traveling into the wafer surface. Some ionic or metal contaminants however, may already be present in the silicon substrate 12 of the wafer 10. The gettering process of the present invention is directed to attracting and trapping these mobile ionic and metal contaminants.

With reference to FIG. 2B, once the (BPSG) layer 16 has been formed on the front side 22 of the wafer 10, a backside 18 of the wafer 10 is thinned and roughened using a chemical mechanical planarization (CMP) step. Chemical mechanical planarization (CMP) is also referred to in the art as chemical mechanical polishing (CMP). In general, chemical mechanical planarization (CMP) involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. Such apparatus for polishing semiconductor wafers are disclosed in U.S. Pat. Nos. 4,193,226 and 4,811,522. Another such apparatus is manufactured by Westech Engineering and is designated as a Model 372 Polisher.

In the present gettering process, the purpose of the chemical mechanical planarization (CMP) is to thin the wafer and to form a backside wafer surface 18 that is roughened. The conditions of the chemical mechanical planarization (CMP) can thus be adjusted to thin the wafer as required and to achieve a surface having a desired roughness.

In addition to roughening the backside 18 of the wafer 10, the chemical mechanical planarization (CMP) step may be adjusted to thin the wafer 10 to a desired silicon thickness. This is shown schematically in FIGS. 3A and 3B. The initial thickness of the silicon substrate 12 of the wafer 10 is shown in FIG. 3A as $t_{si}$. The thinned wafer 10 is shown in FIG. 3B as having a thickness of $t'_{si}$ which is decreased from the original $t_{si}$ by the distance of x.

With a thinned wafer 12 the mobile contaminants will have a smaller diffusion distance to travel to the subsequently formed gettering centers (FIG. 2D). As an example, about 50 microns of the backside of the wafer 10 may be removed during the chemical mechanical planarization (CMP) process step (Step B, FIG. 1).

The chemical mechanical planarization (CMP) step also introduces mechanical damage or damage induced stress in the crystal lattice structure of the silicon substrate 12. This backside crystal damage causes the growth of dislocations that radiate up into the wafer. These dislocations are shown schematically in FIGS. 2B–2D and are designated as item 20. As will hereinafter, be more fully explained these dislocations form gettering centers for trapping mobile impurities or contaminants such as ions or metals moving within the crystal lattice structure of the substrate 12. Subsequent heating of the wafer 12 during annealing (Step D, FIG. 1) increases the mobility of the contaminants and the trapping process. This gettering phenomena is shown schematically in FIG. 2D.

In addition to chemically mechanically planarizing (CMP) the backside 18 of the wafer 10, the front side 22 of the wafer 10 may also be chemically mechanically planarized (CMP) for planarizing the front side 22. This is an optional step that is denoted as step B1 in FIG. 1 and is intended to provide a smooth and planar front side 22 of the wafer 10.

In order to enhance the gettering process however, a gettering agent is also deposited and diffused into the backside 18 of the wafer 10. In a preferred embodiment of the invention the gettering agent is phosphorus. A preferred source of phosphorus is phosphine ($PH_3$) gas or ($POCl_3$) gas. Other compounds of phosphorus and other gettering agents however, such as boron and nickel chloride would also be suitable in this application.

As an example, deposition of the phosphorus may be accomplished by forming a phosphorous glass 24 on the wafer backside 18 and driving in phosphorous by annealing in a furnace in which phosphine ($PH_3$) or ($POCl_3$) gas is added to the deposition gas stream. This is shown schematically in FIG. 2C. In addition, for driving in or diffusing the phosphorus atoms into the silicon substrate 12 the substrate must preferably be heated. This process may be termed a drive in or diffusion anneal. This annealing step (Step D, FIG. 1) in addition to diffusing the gettering agent into the wafer may also serve the function of segregating or trapping the mobile contaminants within the gettering centers formed by the dislocations 20 and by sites of the gettering agent (i.e. phosphorus) within the crystal lattice. As an example, annealing may be performed on the order of about 2 hours at a temperature of about 750° to 1050° C. Annealing may also be performed at a temperature range of from 500° C. to 1150° C. for a period of from as little as 5 minutes to as much as eight hours depending on the desired end product. Additionally the annealing step (Step D) may be combined with the (BPSG) reflow anneal previously described. The phosphorous glass 24 is preferably removed after the annealing drive in.

It is theorized in the art, that the dopant phosphorus atoms move into the Si substrate 12 by filling empty crystal positions within the lattice structure. It is believed that the dopant phosphorus atoms may also move through the spaces between the crystal sites (i.e. interstitial sites). The process parameters such as the time, temperature, and concentration of the deposition gas stream may be varied to achieve a suitable dopant concentration and depth into the substrate. During the phosphorus deposition (Step C, FIG. 1) and annealing process (Step D, FIG. 1) the semiconductor devices 14 formed on the surface of the wafer 10 are protected by the (BPSG) layer 16 or (PSG layer) formed thereon.

As shown in FIG. 2D, impurity diffusion also occurs during the annealing process (step D, FIG. 1) and subsequently thereto by mobile contaminants moving towards and being trapped by the gettering centers. The gettering centers may be formed by the dislocations 20 and by sites of the deposited phosphorous atoms within the crystal lattice of the wafer 10.

Since the wafer 10 has been thinned by the chemical mechanical planarization (CMP) process (Step B, FIG. 1) the mobile contaminants do not have as great a distance to travel before being trapped by a gettering center which may include a dislocation 20, a phosphorus atom, or both.

As a final step the front side of the wafer may again be chemically mechanically planarized (CMP) if needed to further planarize the (BPSG). This is optional step D1 in FIG. 1.

Thus the invention provides a simple yet unobvious process for gettering mobile contaminants in a semiconductor manufacturing process. Among the advantages of the process are:

1. The process is adaptable to large scale repetitive semiconductor manufacture.
2. A semiconductor wafer thickness may be reduced during chemical mechanical planarization (CMP) for decreasing a travel distance of mobile contaminants or impurities during the annealing process.
3. Gettering centers may be located at dislocations formed by roughening the wafer backside of the wafer and at sites of a gettering agent such as phosphorus. Gettering efficiency is thus increased.
4. Semiconductor devices formed on the front side of the wafer may be protected during the gettering process by a protective layer such as (PSG) or (BPSG).
5. An annealing step for driving in the gettering agent and segregating the contaminants may be staged or combined as a single step along with a (PSG) or (BPSG) reflow and planarization.
6. The process can be carried out subsequent to high temperature processes that would tend to detrap the contaminants.
7. The chemical mechanical planarization (CMP) step of the gettering process may be closely controlled to achieve a thinned wafer, with a desired backside surface roughness and a desired gettering effect.

While the particular process as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

REFERENCES

[1] J. Appl. Physics, 64(4), 1988 (R. W. Gregor et al.),

We claim:

1. A semiconductor gettering process comprising:
    processing a front side of a wafer to form semiconductor devices and applying a protective layer over the front side of the wafer;
    thinning and roughening the backside of the wafer using chemical mechanical planarization, CMP, to form dislocations into the wafer;
    depositing and diffusing a gettering agent into the backside of the wafer; and
    annealing the wafer for driving the gettering agent into the wafer and for segregating mobile contaminants at gettering centers formed by the dislocations and by sites of the gettering agent.
2. The process as recited in claim 1 and wherein:
    the protective layer is borophosphorus silicate glass, BPSG.
3. The process as recited in claim 1 and wherein:
    the protective layer is phosphorous silicate glass, PSG.
4. The process as recited in claim 2 and wherein:
    annealing the wafer reflows and planarizes the, BPSG.
5. The process as recited in claim 4 and wherein:
    the gettering agent is phosphorus.
6. The process as recited in claim 5 and wherein:
    the gettering agent is deposited on the wafer backside using phosphine, $PH_3$, added to a gas stream used in annealing.
7. The process as recited in claim 5 wherein:
    the gettering agent is deposited on the wafer backside using, $POCl_3$, added to a gas stream used in annealing.
8. A gettering process for semiconductor manufacture comprising:
    processing a front side of a semiconductor wafer to form semiconductor devices and applying a protective layer over the front side of the wafer;
    thinning and roughening the backside of the wafer using chemical mechanical planarization, CMP, to cause the growth of dislocations into the wafer and to remove a portion of the backside to thin the wafer;
    depositing and diffusing a gettering agent including phosphorus into the backside of the wafer; and
    annealing the wafer for planarizing the protective layer, for driving in the gettering agent, and for trapping mobile contaminants at gettering centers formed at the dislocations and at gettering agent sites within a wafer crystal structure.
9. The gettering process as recited in claim 8 and wherein:
    the annealing is performed at a temperature of about 500° C. to 1150° C. for between 5 minutes to eight hours.

10. The gettering process as recited in claim 8 and wherein:
at least 50 microns of the backside of the wafer is removed by the, CMP.

11. The gettering process as recited in claim 8 and wherein:
the gettering agent is applied as phosphine, $PH_3$, gas added to a gas stream during annealing.

12. The gettering process as recited in claim 8 and wherein:
the gettering agent is applied as a, $POCl_3$, gas added to a gas stream during annealing.

13. The gettering process as recited in claim 8 and wherein:
the front side of the wafer is chemically mechanically planarized, CMP, for planarizing the protective layer before the backside of the wafer is chemically mechanically planarized.

14. The gettering process as recited in claim 8 and wherein:
the front side of the wafer is chemically mechanically planarized, CMP, for planarizing the protective layer after the backside of the wafer is chemically mechanically planarized.

15. A product produced by the process of claim 8.

* * * * *